(12) United States Patent
Song

(10) Patent No.: US 7,559,730 B2
(45) Date of Patent: Jul. 14, 2009

(54) CASSETTE DEVICE FOR ACCEPTING SUBSTRATES

(75) Inventor: Si-Hyun Song, Gyoungsangbok-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 10/673,398

(22) Filed: Sep. 30, 2003

(65) Prior Publication Data

US 2004/0069680 A1 Apr. 15, 2004

(30) Foreign Application Priority Data

Oct. 10, 2002 (KR) .................. 10-2002-0061912

(51) Int. Cl.
*H01L 21/677* (2006.01)
*B65D 85/00* (2006.01)
*A47G 19/08* (2006.01)

(52) U.S. Cl. .............. 414/217; 206/707; 206/711; 206/454; 206/564; 211/41.17; 414/937

(58) Field of Classification Search ............ 414/416.03, 414/416.08, 937; 211/41.17, 41.18, 41.1, 211/41.12; 206/707, 711, 387.15, 454, 564
See application file for complete search history.

(56) References Cited

U.S. PATENT DOCUMENTS

| 1,900,053 | A | * | 3/1933 | Glidden ............... 211/41.1 |
| 3,486,631 | A | * | 12/1969 | Rodman .............. 211/41.18 |
| 4,653,636 | A | * | 3/1987 | Armstrong .............. 206/711 |
| 5,236,548 | A | * | 8/1993 | Stadler et al. ............ 216/91 |
| 5,393,226 | A | * | 2/1995 | Groom ................. 432/258 |
| 5,476,176 | A | * | 12/1995 | Gregerson et al. ........ 206/711 |
| 5,823,361 | A | * | 10/1998 | Babbs ................ 211/41.17 |
| 5,853,214 | A | * | 12/1998 | Babbs et al. ............. 294/161 |
| 6,006,919 | A | * | 12/1999 | Betsuyaku ............. 206/711 |
| 6,219,126 | B1 | * | 4/2001 | Von Gutfeld ............ 349/153 |
| 6,273,275 | B1 | * | 8/2001 | Kim et al. ............. 211/41.18 |
| 6,617,225 | B2 | * | 9/2003 | Boyle et al. ............. 438/455 |
| 6,769,948 | B1 | * | 8/2004 | Inoue ................ 445/66 |

FOREIGN PATENT DOCUMENTS

JP 2000-7148 1/2000

* cited by examiner

*Primary Examiner*—Gregory W Adams
(74) *Attorney, Agent, or Firm*—McKenna Long & Aldridge LLP

(57) ABSTRACT

A cassette device for accepting substrates includes a frame, a plurality of slots protruding from opposing sides of the frame, and at least two supporting bars connected to at least two of the slots.

10 Claims, 5 Drawing Sheets

CASSETTE DEVICE FOR ACCEPTING SUBSTRATES

The present invention claims the benefit of the Korean Patent Application No. P2002-061912 filed on Oct. 10, 2002 in Korea, which is hereby incorporated by reference.

BACKGROUND OF THE INVENTION

1. Field of the Invention

The present invention relates to a cassette device, and more particularly, to a cassette device for accepting substrates.

2. Discussion of the Related Art

In general, a liquid crystal display (LCD) device includes a first substrate having a plurality of thin film transistor (TFT) arrays and a second substrate having a plurality of color filters, wherein the first and second substrates are bonded together and divided into a plurality of liquid crystal display panels.

The bonded first and second substrates have a plurality of spacers provided therebetween in order to maintain a uniform cell gap between. Methods for providing the spacers may include a scattering method and a photolithography method. In the scattering method, the spacers are formed by scattering particles, such as glass or plastic beads, each having a certain particle diameter, on either one of the first or second substrates. However, in the scattering method, since the spacers are randomly scattered on either the first or second substrates, the spacers may be positioned within an effective pixel region. Accordingly, the spacers may reflect or transmit incident light, thereby incorrectly dispersing the light. Thus, light leakage phenomenon occurs and image quality is lowered. For example, in a large-sized liquid crystal display device, since the spacers may unintentionally congregate in specific areas, the image quality is lowered due to defects, such as galactic staining.

In the photolithography method, a photoresist film is provided on the first substrate, which includes the TFT arrays, or on the second substrate, which includes the color filters. Then, the photoresist film is exposed to ultraviolet light through a mask and developed, thereby forming patterned spacers. Accordingly, by forming the patterned spacers to be aligned with a black matrix formed on a liquid crystal display panel, it is possible to prevent lowering of the aperture ratio and image quality. In addition, since it is possible to adjust a cell gap of the liquid crystal display panel with the thickness of the photoresist film, accuracy of the cell gap can be improved.

FIG. 1A is a cross sectional view of bonded first and second substrates having spacers formed by a scattering method according to the related art, and FIG. 1B is a cross sectional view of bonded first and second substrates having spacers formed by a photolithographic method according to the related art. In FIGS. 1A and 1B, a side portion of a first substrate 20, which has a plurality of TFT arrays 1, protrudes from a side portion of a second substrate 30, which has a plurality of color filters 2. Accordingly, a gate pad portion (not shown) and a data pad portion (not shown) are formed along a short side edge and a long side edge of the first substrate 20 that do not overlap the second substrate 30. Thus, the color filters 2 formed on the second substrate 30 are separated by interior dummy regions 31 that correspond to the protruded area of the TFT arrays 1 formed on the first substrate 20.

In addition, each unit liquid crystal display panel is arranged to fully use the first and second substrates 20 and 30. In general, unit liquid crystal display panels are separated with respect to the interior dummy regions 32, and an exterior dummy region 21 is formed along edges of the first and second substrates 20 and 30 to allow for process margins.

After bonding the first substrate 20, which has the TFT arrays 1, to the second substrate 30, which has the color filters 2, the liquid crystal display panels are cut into individual panels. For example, dummy regions 31 are formed on a region where the color filters 2 of the second substrate 30 are separated. Moreover, the interior dummy regions 32 and the exterior dummy region 21 are simultaneously eliminated during the process of cutting the bonded first and second substrates 20 and 30.

In order to maintain a uniform cell gap between the TFT arrays 1 and the color filters 2, the spacers 40 (in FIG. 1A) are formed between the first and second substrates 20 and 30 by the scattering method. Alternatively, the patterned spacers 50 (in FIG. 1B) are formed between the first and second substrates 20 and 30 by the photolithography method. However, prior to the bonding of the first and second substrates 20 and 30, each of the first and second substrates 20 and 30 are sequentially placed into an accepting space of a cassette, and are transported for proceeding processes. The cassette for accepting a substrate in accordance with the related art will be described in detail with reference to accompanying drawings.

FIG. 2 is a perspective view of a cassette for accepting substrates according to the according to the related art. In FIG. 2, a cassette for accepting substrates includes a frame 100 having an open front surface and a plurality of slots 101 that protrude from both sides of the frame 100 to support a substrate 102 within the frame 100. In FIG. 3, by providing four slots 101 uniformly along both sides of the frame 100, the substrate 102 can be supported using a point-contact configuration. For example, if the cassette accommodates twenty substrates 102, i.e., twenty stories, each story has eight slots 101 protruded form both sides of the frame by the same distance.

In order to fabricate a large-sized liquid crystal display device, large-sized substrates are used, wherein bonded substrates 102 weigh about 4.4 kg. Accordingly, point loads of 0.55 kg are placed onto each of the eight slots 101. However, as shown in FIG. 1B, when the patterned spacers 50 are formed between the bonded substrates 102 by the photolithographic method, the patterned spacers 50 may become deformed within regions corresponding to the point load of the eight slots 101 due to the load of the bonded substrates 102. Accordingly, when the patterned spacers 50 become deformed, a cell gap between the bonded substrates 102 becomes uneven and image quality of the liquid crystal display device is lowered due to formation of black spots.

During fabrication of a small-sized liquid crystal display panel, a liquid crystal injection method is commonly used after cutting bonded substrates into individual liquid crystal display panels. However, when the liquid crystal injection method is used for a large-sized liquid crystal display panel, significant amounts of time are required to completely inject liquid crystals into the gap between the bonded substrates, wherein productivity is lowered. Accordingly, in order to fabricate a large-sized liquid crystal display panel, a liquid crystal dispensing method is used.

In the liquid crystal dispensing method, a liquid crystal display device can be fabricated by bonding two substrates together and cutting the bonded substrates into individual unit liquid crystal display panels after dispensing liquid crystals onto one of a TFT array substrate or a color filter substrate. However, during fabrication of large-sized liquid crystal display panels using the liquid crystal dispensing method, when a size of one of the TFT array or color filter substrates increases, a total load greatly increases. Accordingly, the increased loading is more likely to deform the patterned spacers and image quality of the liquid crystal display device is significantly lowered.

SUMMARY OF THE INVENTION

Accordingly, the present invention is directed to a cassette device for accepting substrates that substantially obviates one or more of the problems due to limitations and disadvantages of the related art.

An object of the present invention is to provide a cassette device for accepting substrates capable of preventing generation of defects due to point contact loading of the substrates.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a cassette device for accepting substrates includes a frame, a plurality of slots protruding from opposing sides of the frame, and at least two supporting bars connected to at least two of the slots.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the illustrated embodiments of the present invention, examples of which are illustrated in the accompanying drawings.

Figure 1A:
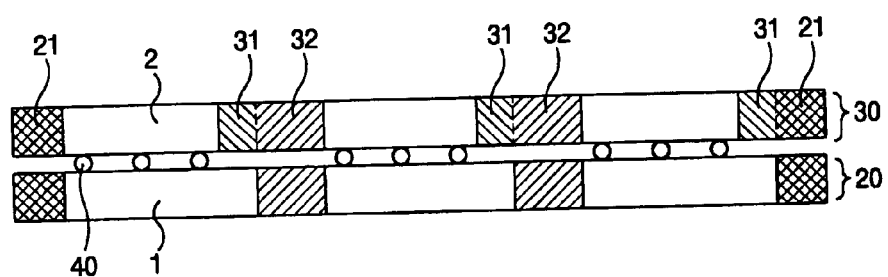
FIG. 1A is a cross sectional view of bonded first and second substrates having spacers formed by a scattering method according to the related art.
Figure 1B:
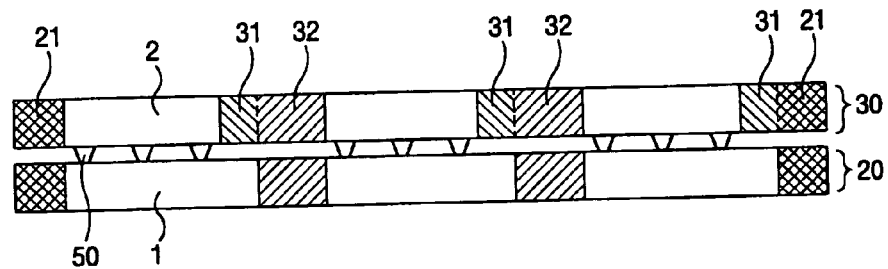
FIG. 1B is a cross sectional view of bonded first and second substrates having spacers formed by a photolithographic method according to the related art.
Figure 2:
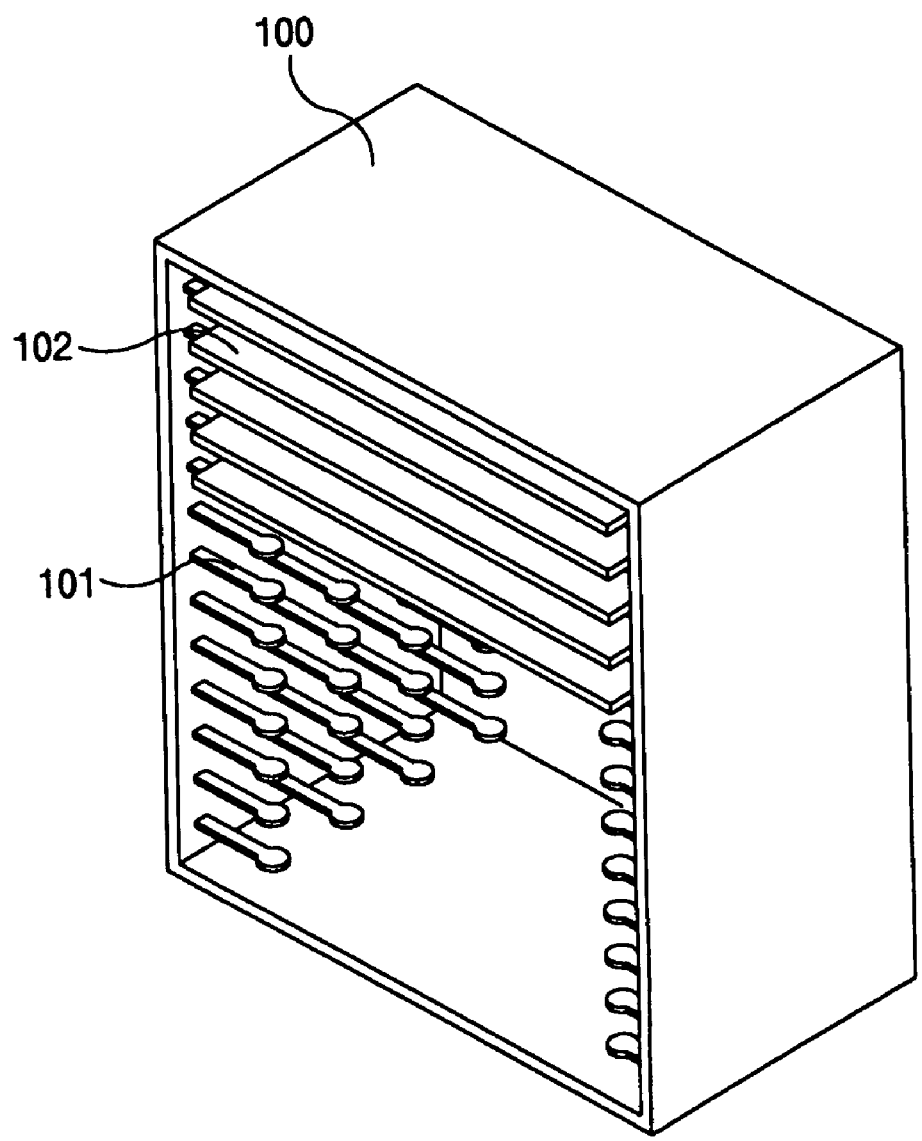
FIG. 2 is a perspective view of a cassette for accepting substrates according to the related art.
Figure 3:
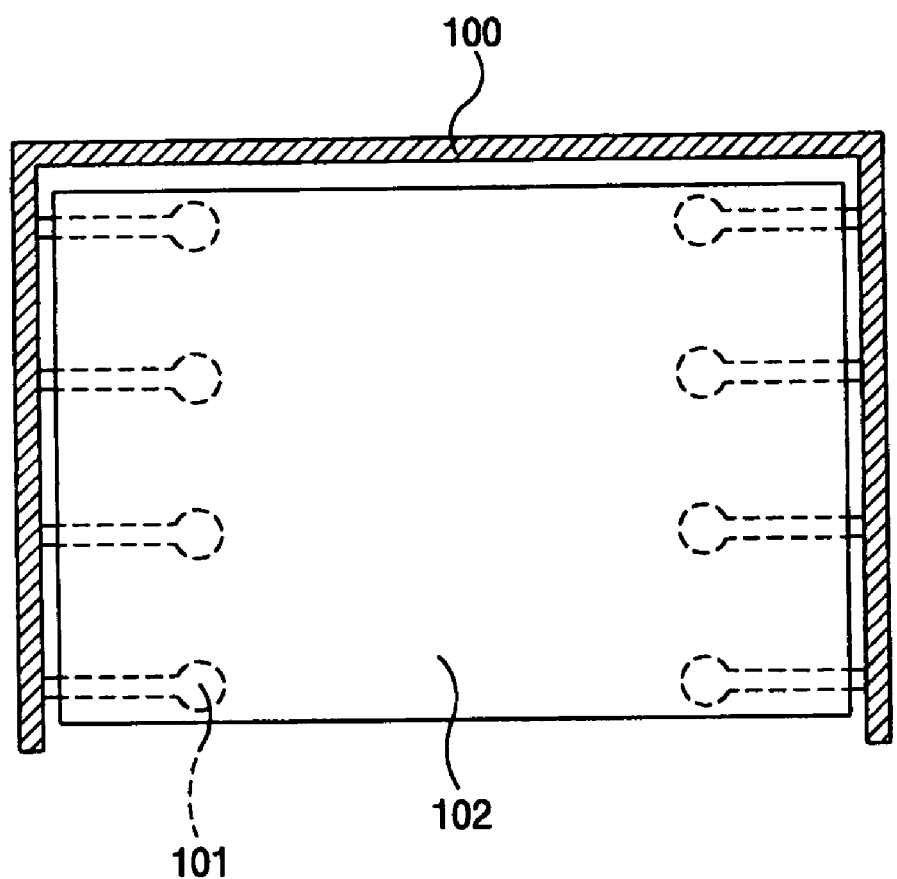
FIG. 3 is a plan view of a substrate supported by supporting pins of FIG. 2 according to the related art.
Figure 4:
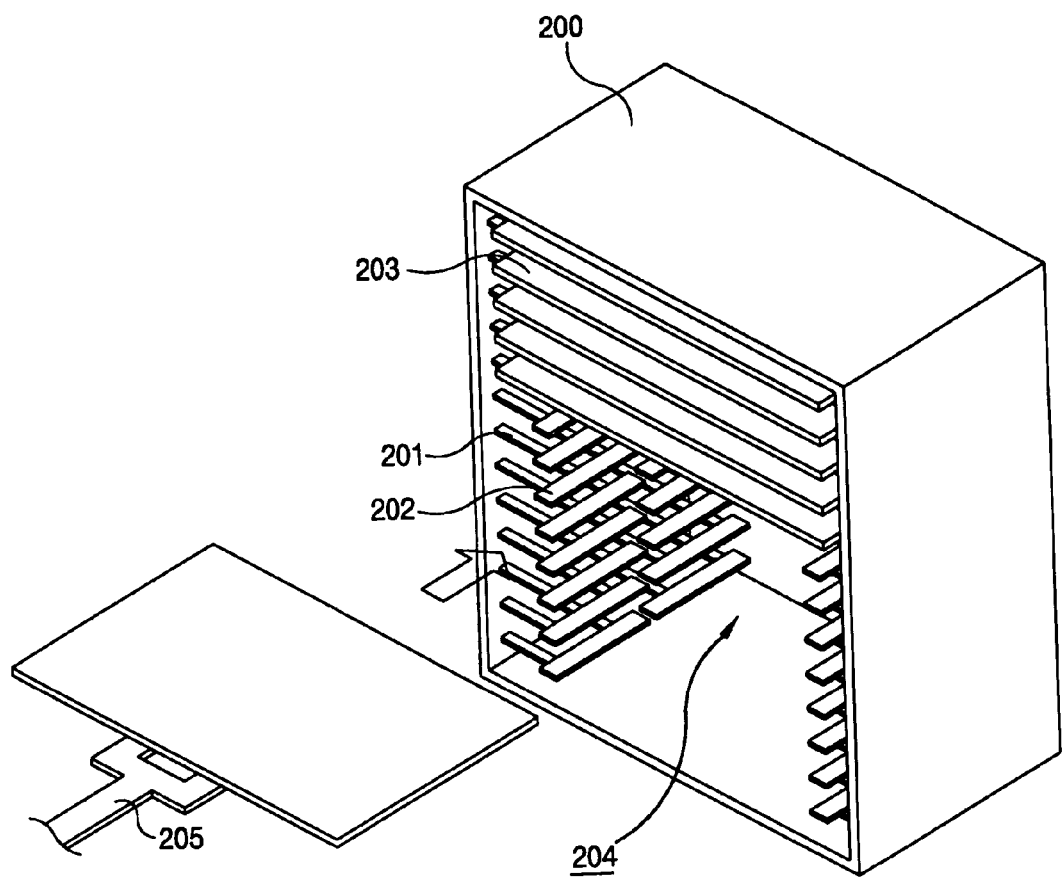
FIG. 4 is a perspective view of an exemplary cassette device for accepting substrates according to the present invention.
Figure 5:
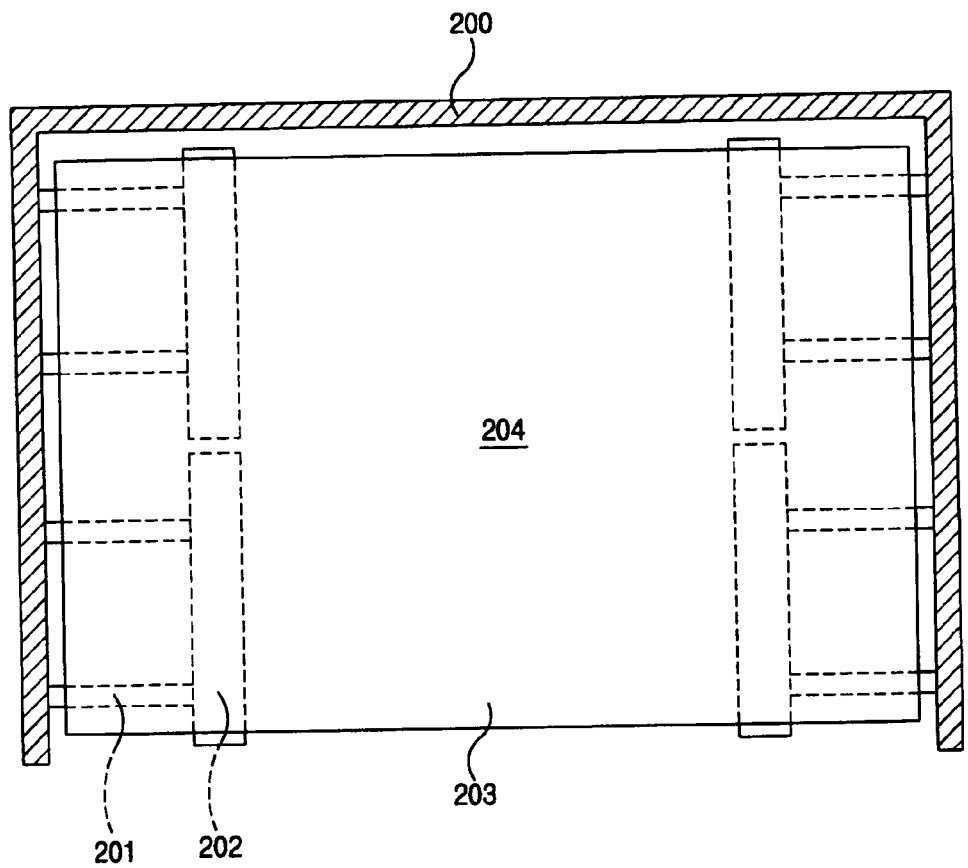
FIG. 5 is a plan view of a substrate supported by exemplary supporting bars of FIG. 4 according to the present invention.

FIG. 4 is a perspective view of an exemplary cassette device for accepting substrates according to the present invention, and FIG. 5 is a plan view of a substrate supported by exemplary supporting bars of FIG. 4 according to the present invention. In FIG. 4, a cassette device may include a frame 200 having an open front, a plurality of slots 201 protruding from both sides of the frame 200, and supporting bars 202 connecting end portions of at least two of the slots 201 to support a bonded substrate 203. For example, the bonded substrate 203 may include a first TFT array substrate and a color filter substrate. In FIG. 5, the supporting bars 202 support the substrate 203 using a distributed loading configuration. Accordingly, eight of the slots 201 protrude to support the bonded substrate 203, wherein four of the slots 201 extend from an interior side surface of the frame by about 170 mm to support each side of the substrate 203. In addition, the supporting bars 202 include acetal resin material(s) in order to minimize surface damage of the bonded substrate 203. Accordingly, spacers (not shown) formed between the TFT array and color filter substrates may maintain a uniform cell gap therebetween.

Alternatively, a liquid crystal layer may be provided on one of the TFT array and color filter substrates using a liquid crystal dispensing method, and a sealant may be provided on one of the TFT array and color filter substrates. Of course, the liquid crystal layer and the sealant may both be provided on one of the TFT array and color filter substrates. Accordingly, each of the TFT array and color filter substrates may be received within the frame 200 before or after being bonded together.

By using the liquid crystal dispensing method, although the total load of the bonded substrate 203 may increase, deformation of patterned spacers provided between the TFT array and color filter substrates may be prevented due to the distributed loading on the supporting bars 202.

In FIG. 4, the bonded substrate 203, or one of the TFT array and color filter substrates, may be loaded onto a robot arm 205 and transferred into the frame 200 at a height a little higher than the supporting bars 202. When the robot arm 205 descends into a space 204 at a center portion of the frame 200, the bonded substrate 203 may be supported by a surface contact with the supporting bars 202. Then, the robot arm 205 may be lowered to place the bonded substrate 203 onto the supporting bars 202, and the robot arm 205 may be withdrawn from the frame 200.

In addition, more than four supporting bars 202 may be provided along each side of the bonded substrate 203, thereby providing support for larger bonded substrates 203.

It will be apparent to those skilled in the art that various modifications and variations can be made in the cassette device for accepting substrates of the present invention without departing from the spirit or scope of the invention. Thus, it is intended that the present invention cover the modifications and variations of this invention provided they come within the scope of the appended claims and their equivalents.

What is claimed is:

1. A supporting structure for supporting mother substrates having a length, a width and a thickness, comprising:

a frame having a length, a width and a height, the length being substantially greater than the width, wherein the length and width of the frame corresponds to the length of width of inserted mother substrate, respectively;

a plurality of first support members protruding from a first side of the frame and a plurality of second support members protruding from a second side of the frame opposing to the first side;

first rectangular supporting bars connected to two support members of the first support members and second rectangular supporting bars connected to two support members of the second support member, wherein the first and second supporting bars are disposed at a distance of about 170 mm from the frame; and a robot arm for loading the mother substrates onto first and second the support members and the first and second rectangular supporting bars, wherein the first and second supporting bars contact and support a lower surface of inserted mother substrate along first and second parallel sides of the inserted mother substrates at opposing parallel regions of the lower surface, wherein the length of the first supporting bars are longer than the distance between the two first support members so that the first supporting bars cross the two first support members and extend to the outer portion of the region between the first supporting members and the length of the second supporting bars are longer than the distance between the two second support members so that the second supporting are crossed the two second support members and extend to the outer portion of the region between the second support members, thereby the first supporting bars are slightly spaced from each other and the second supporting bars are slightly spaced from each other, so that the first and second supporting bars are in contacted with substantially the whole width of the first and second parallel side of the inserted mother substrate to uniformly distribute a load to the patterned spacers in substantially the whole width of the first and second parallel sides of the inserted mother substrate, wherein the robot arm transfers the mother substrates into the frame at a height a little higher than the supporting bars and descends into a space at a center portion of the frame so that the mother substrates are contacted with the support members and the first and second rectangular supporting bars.

2. The structure according to claim 1, wherein the supporting bars include acetal resin material.

3. The structure according to claim 1, wherein the supporting bars contact the substrate via surface contact.

4. The structure according to claim 1, wherein the first and second support members include a first set of support members disposed to extend along a first plane within the frame and a second set of support members disposed to extend along a second plane different from the first plane within the frame.

5. The structure according to claim 4, wherein each of the first and second sets of support members includes a first pair of support members extending from one of the opposing sides of the frame and a second pair of support members extending from another one of the opposing sides of the frame.

6. The structure according to claim 5, wherein the supporting bars extend along the first parallel sides of the substrates.

7. The structure according to claim 6, wherein the supporting bars extend past edge portions of the substrates along the first parallel sides of the substrates.

8. The structure according to claim 5, wherein a total number of supporting bars is dependent upon a size of the frame.

9. The structure according to claim 8, wherein the supporting bars prevent deformation of the liquid crystal display panels.

10. The structure according to claim 1, wherein the substrates are transferred onto the supporting bars by a robot arm.

* * * * *